(12) United States Patent
Myerson

(10) Patent No.: US 6,596,077 B2
(45) Date of Patent: *Jul. 22, 2003

(54) CONTROLLED NUCLEATION OF PROTEIN CRYSTALS

(75) Inventor: Allan S. Myerson, Chicago, IL (US)

(73) Assignee: Illinois Institute of Technology, Chicago, IL (US)

( * ) Notice: Subject to any disclaimer, the term of this patent is extended or adjusted under 35 U.S.C. 154(b) by 24 days.

This patent is subject to a terminal disclaimer.

(21) Appl. No.: 09/918,935

(22) Filed: Jul. 31, 2001

(65) Prior Publication Data

US 2003/0024470 A1 Feb. 6, 2003

(51) Int. Cl.[7] ............................................... C30B 29/54
(52) U.S. Cl. .......................... 117/68; 117/69; 117/935; 117/936; 117/937
(58) Field of Search ............................ 117/68, 69, 935, 117/936, 937

(56) References Cited

U.S. PATENT DOCUMENTS

| | | | |
|---|---|---|---|
| 4,330,363 A | 5/1982 | Biegesen | |
| 4,737,232 A | 4/1988 | Flicstein | |
| 5,271,795 A | 12/1993 | Ataka | |
| 5,683,935 A | 11/1997 | Miyamoto | |
| 5,976,325 A | 11/1999 | Blanks | |
| 6,055,106 A | 4/2000 | Grier | |
| 6,426,406 B1 * | 7/2002 | Myerson et al. | 530/418 |
| 2002/0120105 A1 * | 8/2002 | Myerson et al. | 530/550 |
| 2002/0137902 A1 * | 9/2002 | Myerson et al. | 530/412 |

FOREIGN PATENT DOCUMENTS

RU         2070413      * 12/1996

* cited by examiner

Primary Examiner—Robert M Kunemund
(74) Attorney, Agent, or Firm—Technoprop Colton LLC

(57) ABSTRACT

A method for the non-photochemical laser induced nucleation in which short high-intensity laser pulses are used to induce nucleation in supersaturated solutions including protein solutions. The laser induces nucleation only in the area where the beam is focused or passes through, resulting in fewer nuclei than would be achieved by spontaneous nucleation. In addition, the laser reduces nucleation time significantly.

33 Claims, 1 Drawing Sheet

CONTROLLED NUCLEATION OF PROTEIN CRYSTALS

BACKGROUND OF THE INVENTION

1. Technical Field

The technical field of the present invention is generally the controlled nucleation of protein crystals, and more specifically non-photochemical laser induced nucleation combined with standard methods of protein crystal growth to result in a better quality of protein crystal.

2. Prior Art

A new method to induce and control nucleation discovered by Allan S. Myerson is known as non-photochemical laser induced nucleation. Myerson, A. S. et al., Phys. Rev. Lett. 77, 3475 (1996). In this method, short high-intensity laser pulses have been shown to induce nucleation in supersaturated solutions or urea.

The growth of protein crystals for structure determination relies on spontaneous nucleation. Seeded growth is normally not practical, since it would require a good quality protein crystal, which is not available. Other methods routinely used in small-molecule crystal growth such as cooling and the more common evaporation methods do not allow for nucleation control. Since the purpose of protein crystal growth experiments is to crystallize a few large high quality crystals, uncontrolled spontaneous nucleation is a significant problem. In the experiments using the "hanging droplet" technique for example, two to three nuclei per drop would usually result in large crystals of high quality while larger numbers of nuclei per drop would not. Nucleation is known to strongly depend on supersaturation. Rosenberger, F., Fundamentals of Crystal Growth (Springer-Verlag, Berlin, 1979); Chernov, A. A., Modern Crystallography III Crystal Growth (Springer-Verlag, Berlin, 1984); and McPherson, A., Eur. J. Biochem., 189, 1 (1990). Such dependence demands precise regulation of protein supersaturation, precipitant concentration, pH, purity, thermal history and temperature.

Nucleation requires that protein molecules aggregate together in clusters and these clusters reach a critical size where they are thermodynamically favored to grow. In addition, the molecules must overcome the entropic barrier and arrange themselves in the appropriate lattice arrangement for the resulting nuclei to be crystalline. The higher the supersaturation, the smaller the critical radius. Rosenberger F. et al., J. Crystal Growth, 168, 1 (1996). Because the metastable zones of protein solutions are much wider than those of small molecules, the nucleation of crystalline proteins begins at very high levels of supersaturation (often several hundred to thousand percent). Pusey, M. L., J. Crystal Growth, 110, 60 (1998); and McPherson, A., et al., Structure, 3, 759 (1995). Proteins often can nucleate and grow in an amorphous form. This generally is not desired. Recent work has shown that the second virial coefficient can be used to identify solution conditions favorable for crystallization. George, A. et al., Acta Cryst., D50, 361 (1994); Rosenbaum, D. F. et al., Phys. Rev. Lett., 76, 150 (1996); and Rosenbaum, D. F. et al., J. Crystal Growth, 169, 752 (1996).

In 1996, during a study designed to investigate whether supersaturated urea solutions would display non-linear optical properties similar to those of urea crystals because of the presence of ordered molecular clusters, the present inventor discovered serendipitously that the solutions nucleated. Myerson, A. S. et al., Phys. Rev. Lett. 77, 3475 (1996). The experiment involved the use of pulses of linearly polarized near infrared laser light. This wavelength of light was non-absorbing in urea solutions, which ruled out a photochemical mechanism. It was postulated that there was an alignment of molecules along the direction of the polarization due to the optical Kerr effect that reduced the entropy barrier to crystallization. Further studies of laser induced nucleation in the laboratories of the present inventor have demonstrated that the laser will induce nucleation in other substances (I-alanine, glycine, adipic acid, succinic acid), will reduce the nucleation induction time significantly when compared to an identical control, and will result in fewer crystals then observed in a spontaneously nucleated control. Matic, J., Masters Thesis, Polytechnic University.

Complete or highly detailed steric structures of proteins are indispensable information for an understanding of the specific properties and functions of the proteins. For example, information on the three-dimensional structure of a protein can serve as the basis for understanding the mechanism of function appearance in a biochemical system by an enzyme or hormone. In many fields, such as pharmaceutical science and chemical engineering, the three-dimensional structure of a protein can provide information for basic molecular design, specific drug design, protein engineering, biochemical synthesis and the like.

X-ray crystal structural analysis is the most cogent and high-accuracy means of obtaining three-dimensional steric structural information of proteins at atomic levels at present. Thus, to determine the three-dimensional structure of a protein by X-ray crystal structural analysis, one must have protein crystals of sufficient size and quality. Crystallization of a protein currently is performed by eliminating a solvent from an aqueous or anhydrous solution containing the protein, resulting in a supersaturated state and growing a crystal. However, there are several problems in protein crystallization conducted using the current art.

As discussed previously, it is difficult to obtain a crystal of excellent crystallinity or a large-sized single crystal. One reason may be that a biological macromolecule is readily influenced by gravity since its molecular weight is generally large and causes convection in the solution. Rosenberger, F., J. Cryst. Growth, 76, 618 (1986). This convection can reduce the crystal growth rate, or can cause anisotropic growth. Proteins also are sensitive to the crystallization conditions. The environment, pH, ionic strength and temperature of the solution, and type and dielectric constant of the buffer solution, and the like, can affect protein crystal growth. As a result, it has been difficult to obtain acceptable quantities of acceptable protein crystals, with most protein crystals being small, of less than excellent crystallinity, and in small quantities. Thus, crystallization of proteins is the weakest link in X-ray crystal structural analysis.

Others have used lasers to induce the crystallization of materials. For example, U.S. Pat. No. 4,330,363 to Biegesen et al. discloses thermal gradient control for enhanced laser-induced crystallization of predefined semiconductor areas and does not disclose or pertain to protein areas. Biegesen '363 discloses a specific method of converting predefined areas of semiconductor material into single crystal areas and does not apply to the lased-induced nucleation of protein crystals or the controlled nucleation of protein crystals.

U.S. Pat. No. 4,737,232 to Flicstein et al. discloses a process for depositing and crystallizing a thin layer of organic material using laser energy. Flicstein '232 discloses a specific method of depositing and crystallizing a thin layer of an organic material on a substrate, and using the laser to desorb material, and also does not apply to the lased-induced nucleation of protein crystals or the controlled nucleation of protein crystals.

U.S. Pat. No. 5,271,795 to Ataka et al. discloses a method of growing large crystals by locally controlling solution temperatures. Ataka '795 discloses a method for growing protein crystals using the temperature dependence of solubility of a crystalline protein material, causing the protein crystals to be deposited by controlling the temperature of a localized portion of the solution. No laser is disclosed or suggested to induce or control the nucleation of protein crystals, the crystallization occurring by using warm water.

U.S. Pat. No. 5,683,935 to Miyamoto et al. discloses a method of growing semiconductor crystals only and does not disclose or pertain to protein areas. Miyamoto '935 discloses a specific method of semiconductor crystallization by using laser light. This invention pertains to semiconductors, and does not have the same applicability to liquid solutions containing proteins.

U.S. Pat. No. 5,976,325 to Blanks discloses the laser-induced nucleation of purified aluminum hydrate crystals, including in supersaturated solutions. Although Blanks '325 possibly can be applied to other supersaturated solution, there is no teaching or suggestion of using the process on organic materials or in fields unrelated to aluminums.

U.S. Pat. No. 6,055,106 to Grier et al. discloses a method and apparatus using laser light to assemble or direct particulate materials. Grier '106 discloses a method for manipulating a plurality of biological objects including the crystallization of proteins. However, the invention is an optical trap that splits a single light beam into several, focuses the several light beams to form a focused spot for forming the optical trap, which is unrelated to the present invention.

Thus, it can be seen that no one has developed a successful method for the controlled nucleation of protein crystal growth that results in fewer larger protein crystals of better quality, a reduction in the nucleation induction time for growing protein crystals, and an increase in the overall rate of protein crystal growth. The present invention is directed to this end, namely, an improvement in the quality and size of protein crystals.

BRIEF SUMMARY OF THE INVENTION

The present invention provides a method to control the nucleation of proteins in a liquid solution so that nucleation only occurs in a small part of the overall liquid solution. By controlling the number of nuclei, larger crystals result, which gives better results in x-ray structure analysis. One benefit of the invention is an improved rate of production and quality of protein crystals needed for determination of structures.

One purpose of controlling protein crystal growth is to produce protein crystals of superior quality and larger size for structure determination by x-ray crystallography. The quantity of protein crystals nucleated in a protein solution determines ultimate size, while solution composition, pH, supersaturation, temperature and purity control the protein crystal quality and structural resolution. It has been found that control of nucleation at appropriate crystallization conditions would improve the size and quality of protein crystal. In addition, it has been found that the ability to induce nucleation on demand (or to reduce the nucleation induction time) allows more successful protein crystal growth in shorter time periods.

The new method of the invention is a non-photochemical laser induced nucleation. Short high-intensity laser pulses are used to induce nucleation in supersaturated solutions including protein solutions. The laser induces nucleation only in the area where the beam is focused or passes through, resulting in much fewer nuclei than would be achieved by spontaneous nucleation. In addition, the laser reduces nucleation time significantly.

The method of non-photochemical laser induced nucleation of protein crystals as disclosed below, when combined with standard methods of protein crystal growth, results in fewer larger crystals of better quality. In addition, this method allows a reduction in the nucleation induction time so as to increase the overall rate of protein crystal growth. Thus, this results in an improvement in the quality and size of protein crystals and allows for more successful experiments per unit time.

Generally, the present invention provides a method for the controlled nucleation of protein crystal growth. The present invention further provides a method for the controlled nucleation of protein crystal growth that results in fewer larger protein crystals of better quality, a reduction in the nucleation induction time for growing protein crystals, and an improvement in the quality and size of protein crystals.

By employing the present invention, those skilled in the art can identify and optimize appropriate conditions of power, pulse length and polarization for the laser-induced nucleation of a number of different proteins so as to provide larger and higher diffraction quality protein crystals compared to current methods at identical conditions. Further, the present invention results in a reduction of the nucleation induction time needed for protein crystals when compared with spontaneous nucleation at identical conditions.

Further, this is the first time that laser-induced nucleation has been used to initiate the formation of protein crystals in protein solutions that will not spontaneously nucleate to form protein crystals.

These features and advantages of the present invention will become apparent to those of ordinary skill in the art when the following detailed description of the preferred embodiments is read in conjunction with the appended figure.

DETAILED DESCRIPTION OF THE PREFERRED EMBODIMENTS

Figure 1:
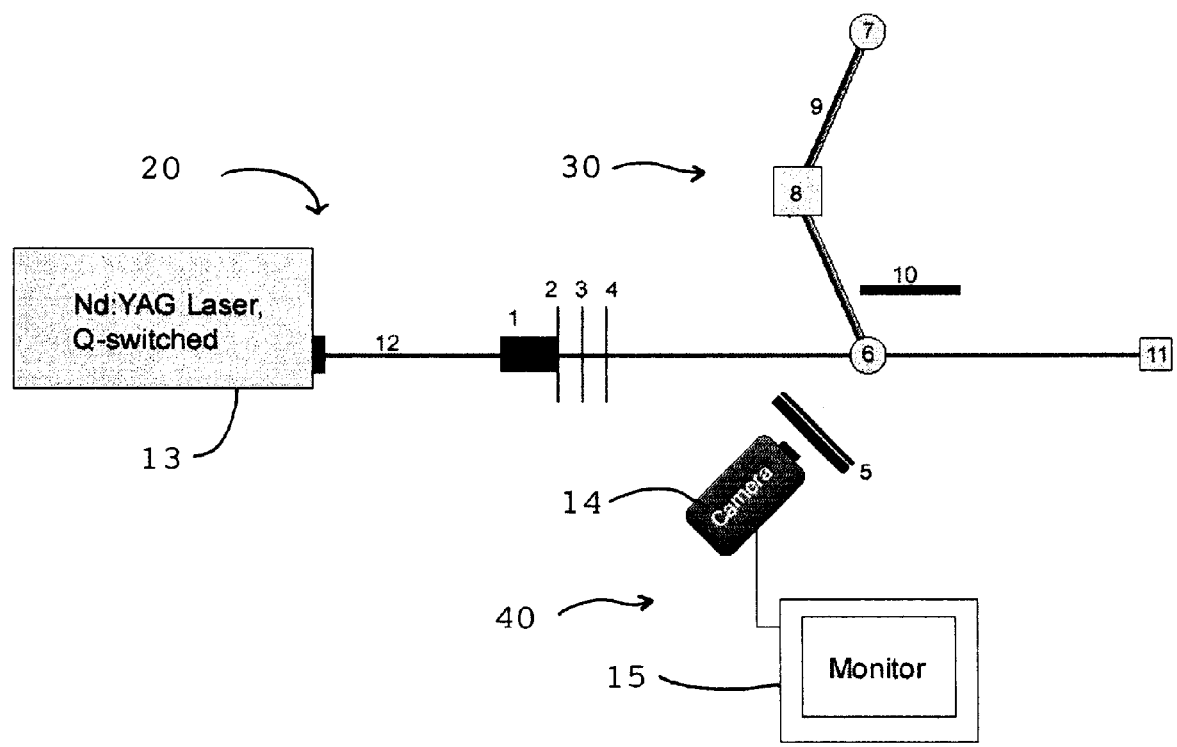
FIG. 1 is a schematic view of an example apparatus used to carry out the method of the present invention.

The purpose of the present invention is to produce protein crystals of superior quality and larger size. All current methods used to grow protein solutions rely on uncontrolled spontaneous nucleation that can occur anywhere in the solution. This uncontrolled nucleation often results in many small crystals that are not useful for structure determination. The present invention is a method to control nucleation in protein solutions allowing for an improvement in size and quality of protein crystals obtained. In addition, the potential shortening of nucleation induction time employing this method improves the efficiency of protein crystal growth experiments by allowing more experiments to be completed in a shorter time.

The quantity of crystals nucleated in a protein solution determines ultimate crystal size while solution composition, pH, supersaturation, temperature and purity control the crystal quality and structural resolution. Control of nucleation, therefore, at appropriate crystallization conditions can improve the size and quality of protein crystals. In addition, a method to induce nucleation on demand (or to reduce the nucleation induction time), such as the present method, can allow more successful protein crystal growth experiments in shorter time periods.

The present invention employs a method to induce and control nucleation developed by the inventor and known as non-photochemical laser induced nucleation. In this method, short high-intensity laser pulses have been shown to induce nucleation in supersaturated solutions including protein solutions. The laser will induce nucleation only in the area where the beam is focused or passes through the solution or sample, resulting in much fewer nuclei than would be achieved by spontaneous nucleation in an identical solution or sample. In addition, the laser reduces nucleation induction time significantly. The present method, therefore, has the potential to decrease the time needed for protein crystal growth experiments (thus increasing the number of experiments which can be done) and increasing the size and quality of crystals produced.

1. Theoretical Basis and Rationale

By its very nature, a system in a metastable state (in the present case the buffered protein/precipitant solution) is bound to pass eventually into a stable state. This passage, known as the nucleation process, has a random nature. For example, in supersaturated solutions, random fluctuations of solute concentration can trigger the onset of nucleation. One of the most important characteristics of the nucleation process is its characteristic time, known as the induction time (time needed for a metastable system to relax to thermodynamic equilibrium). At a given set of conditions, the induction time is a random quantity that varies widely. This time should not be confused with the shorter time during which the metastable stationary size-distribution of subcritical clusters is established.

A pre-nucleating cluster is a complex system consisting of solute molecules and associated solvent molecules. Description of the instantaneous state of such a system requires hundreds of coordinates with the crystalline state representing a small volume in the configuration space. The laser-induced nucleation of the present invention begins the ordering process in the cluster thus allowing it to find the crystalline state more rapidly.

The laser can induce nucleation in aged supersaturated solutions of substances, and the ability of the laser to induce nucleation is a strong function of both the supersaturation and the aging time. In general, the laser can reduce the nucleation induction time by more than half in certain systems. For example, in urea solutions, an aged solution of 30% supersaturation would nucleate spontaneously after more than 10 days. The same solution would nucleate immediately when exposed to a short pulse of the laser if aged at least 4 days. This implies that the laser is ordering existing clusters of molecules in solution as opposed to aiding in the formation of the clusters. Further observation of such the nucleation of such solutions also indicates that the nucleation occurs only in the path of the beam through the solution. The usual result is one or possibly two crystals from the laser induced nucleation. The number of crystals that occur in spontaneously nucleated identical samples would vary over a wide range from 2 or 3 to a large number greater than 10.

2. Apparatus

A general schematic of one apparatus used for the present method is shown schematically in FIG. 1. The apparatus generally comprises an optical table comprising a laser setup 20, a sample setup 30 and a monitoring setup 40. The laser setup 20 comprises a laser 13, a black tube 1, a tube aperture 2, a half wave plate 3, and a polarizer 4.

The sample setup 30 comprises a supersaturated sample 6 contained in a cuvette or other appropriate container, such as a test tube, a magnetic stage 8, and a sample holder 9. The cuvette or other appropriate container must allow the selected wavelength of laser light to pass through without significant distortion, such that the laser pulses 12 can act upon the sample 6.

An experimental control sample 7 can be included, but is optional. For example, one suitable experimental control sample is the same supersaturated protein as used in the laser nucleation method, but is allowed to spontaneously nucleate without being subjected to laser light. The sample holder merely is a structure having the ability to hold the sample 6 and the experimental control sample 7 during the process.

The monitoring setup 40 also is optional and comprises a camera 14 coupled to a monitor 15 allows the user to monitor the process. A converging lens and an IR filter 5 magnifies the sample image and protects the camera 14 from stray or scattered light, respectively. In general, the monitoring setup 40 is constructed merely to monitor the process and can be configured as necessary or desired for optimum monitoring without undue experimentation by one of ordinary skill in the art.

Many of the protein crystal nucleating experiments were conducted with a switched Nd:YAG laser oscillator-amplifier system operating at 1064 nm and having a tube aperture 2 of d=1.981 mm, on a micrometer stage. The half wave plate 3 was keyed to the laser 13 wavelength and for the experimental laser wavelength of 1064 nm, the half wave plate is a 1064 nm half wave plate. A beam stopper 11 was used to prevent the laser pulses 12 from exiting the system and is for safety reasons. This particular laser 13 produces a 10-pps train of 9-ns laser pulses 12. A portion of the annular beam 12 from the laser 13 with approximately constant intensity is selected by passing the beam 12 though an m-mm diameter circular aperture 2 and then through the test tube or cuvette containing the supersaturated sample solution 6.

The video camera 14 of the monitoring setup 40 is set up to record any changes in the state of the sample 6 during and after laser illumination. The IR filter 5 is placed in front of the camera 14 lens to prevent damage from scattered light. The convex (convergent) lens is placed in front of the camera 14 to magnify the image.

The use of cuvettes or Pyrex® sample tubes for solution samples 6 particularly is suited to situations in which supersaturation is generated by cooling. This normally is accomplished either by making the original sample 6 as a saturated solution at higher temperature and letting the sample 6 cool to room temperature for an experiment or by using a jacketed cuvette in which the sample 6 can be cooled and the temperature controlled.

It should be recognized by those of ordinary skill in the art that the experimental apparatus and setup previously described can be varied and optimized without undue experimentation, as the primary focus of this invention is the ability to nucleate a protein solution with laser light. Further, the experimental apparatus and setup previously described can be used in conjunction with many known crystal growing techniques and apparatuses, as the experimental apparatus and setup, as well as the laser nucleation process itself, are for the initiation of the protein crystallization, and not necessarily for the subsequent crystal growth period. Other laser nucleation setups are contemplated.

3. Method

Currently, in protein crystal growth experiments, supersaturation usually is generated by evaporation of the solvent.

In the classical "hanging droplet" method, a droplet of the buffered protein/precipitant solutions is suspended from the underside of a sealed microscope cover slip, which then is placed over a small well containing a milliliter reservoir of the precipitant solution. The initial conditions are such that the solvent diffuses from the protein solution towards the reservoir solution making the solution supersaturated. Crystallization then was initiated spontaneously or by any of the known methods. The resulting crystals were small in size and quantity, and not of excellent crystallinity.

The laser induced nucleation experiments were done by preparing protein solutions in clean cuvettes or sample tubes of a known concentration at an elevated temperature and cooling these solutions slowly to room temperature. These solutions were then supersaturated and metastable. Samples then were divided into a control group and a group to be irradiated by the laser. Samples were aged for periods of days. Aging involves letting the metastable supersaturated solutions sit for periods of time (usually days) to allow the formation of molecular clusters in the solution that are close to the critical size.

The supersaturated protein solutions then, preferably prior to any spontaneous nucleation or other nucleating event, were subjected to pulses from the laser. As discussed in more detail subsequently, protein crystals nucleated along the path of the laser beam through the supersaturated protein solution. It was found that in the absence of spontaneous nucleation and other nucleating events, crystals only nucleated along the path of the laser beam through the solution. It was further found that a relatively small number of crystals nucleated when compared to conventional spontaneous nucleation processes, and that the crystals that did nucleate were able to grow into larger crystals of better crystallinity when compared to conventional spontaneous nucleation processes.

4. Reactants

The present method was conducted with proteins in buffer solutions. A solution of the selected protein was prepared in a precipitant and a buffer. Solutions were prepared initially containing a predetermined percentage of the selected protein and precipitant. These solutions then were supersaturated to known levels of 25%, 50%, 75%, 100%, 150% and 200% by evaporation of water. The samples then were divided into a control group and a group to be exposed to the laser and aged. Following is a general example of one such solution.

A solution of lysozyme was prepared with sodium chloride and a buffer (0.1M sodium acetate) at pH of 4.0 and a temperature of 25C. Solutions were prepared initially containing 4% lysozyme and 1% sodium chloride. These solutions then were supersaturated to known levels of 25%, 50%, 75%, 100%, 150% and 200% by evaporation of water. The samples then were divided into a control group and a group to be exposed to the laser and aged. Lysozyme was selected as an example because it provides a good general representation of proteins, and the results of lysozyme can be expounded to the class of proteins as a whole. Those of ordinary skill in the art commonly use lysozyme systems in protein crystallization experiments. Lysozyme systems can easily translate to other systems using other proteins, precipitants, and buffers.

The method translates well to other protein solutions. Example proteins that can be used include, but are not limited to, serine proteases, pepsin, amylase, lipase, carboxypeptidase, lysozyme, concanavalin A (from jack bean), concanavalin B (from jack bean), canavalin, urease, abrin, ricin, pea lectin, emulsin, edestin, hemoglobin, myoglobin, rubredoxin, catalase, peroxidase, ferritin, ceruloplasm, carbonic anhydrase, alcohol dehydrogenase, papain, phytocyanin, tropomyosin, yeast phenylalanine tRNA, insulin, immunoglobulin, thermosylin, serum albumin, beta-lactamase, creatine kinase, alpha-lactalbumin, and aldolase.

Example solvents or precipitants that can be used include, but are not limited to, water, MES,2-(N-morpholino)-ethanesulfonic acid, ammonium acetate, glycerol, spermine, cacodylate, potassium chloride, ethanol, phosphate, HEPES, potassium phosphate, sodium citrate, sodium phosphate, calcium chloride, EDTA, dithiothreitol, sodium acetate, sodium cacodylate, magnesium chloride, sodium azide, 2-methyl-2,4-pentanediol, sodium chloride, tris-HCI, ammonium sulfate, PEG (200-35000) (with PEG 4000, PEG 6000 and PEG 8000 being used most often out of the PEGs).

Example buffers that can be used include, but are not limited to, acetate buffer, citrate buffer, phosphate buffer, sodium acetate buffer, sodium phosphate buffer, and potassium phosphate buffer.

Those of ordinary skill in the art can select combinations of a protein, precipitant and buffer for use in the method, either from the examples given previously or other proteins, precipitants and buffers, without undue experimentation. In fact, varying the proteins, precipitants and buffers, as well as the process parameters, will allow the nucleation of may different types of protein crystals, which then can be characterized and used for subsequent methodologies, such as X-ray studies, pharmaceuticals and experiments.

5. Procedure

The general procedure for the method simply is to create a supersaturated solution of a protein and subject the supersaturated protein solution to laser light for a period sufficient to initiate nucleation of the protein crystals. The protein crystals then are grown using any of the known crystal growth methods.

In more detail, one example procedure that has provided excellent results is to create identical samples for the supersaturated sample and the experimental control sample as disclosed above. The experimental control sample is allowed to spontaneously nucleate without outside influence, such as by the laser, while the supersaturated sample is subjected to laser light. Specifically, the selected laser, such as the Nd:YAG Q-switched laser shown in FIG. 1 and described above, is directed at the supersaturated sample.

In the apparatus shown in FIG. 1, laser pulses emitted from the laser pass through the black tube 1, the aperture 2, and the half wave plate 3 to enable the rotation of the plane of polarization. The plane of polarization is selected to create a coherent beam. The polarization can be either linear or circular. The polarized laser pulses 12 then pass through polarizer 4 to eliminate light not polarized in the desired or selected direction. A calcite prism polarizer 4 is included to eliminate light not polarized in the desired direction. The laser 13 oscillator and amplifier typically are set at maximum power. With the example laser, the estimated peak intensities incident on the supersaturated solution are approximately 0.7 GW/cm$^2$. With the oscillator alone, peak intensities are about on third of this value.

The laser light pulses preferably at between 1 pulse and 100 pulses per hour, with the supersaturated solution being subjected to the laser light for a period of between 0.01 second and 60 seconds. The selection of both the number of pulses per hour and the length of time the supersaturated solution is subjected to the laser light are variable, depending on the type of solution being subjected to the process, and the desired result. One of ordinary skill in the art can select the desired pulse rate and time without undue experimentation.

The now polarized laser pulses are directed at and pass through the supersaturated sample. Nucleation of the protein crystals occurs only in the path of the laser beam through the supersaturated sample solution. Generally, it has been found that only one to three protein crystals nucleate, although it is possible for more than three protein crystals to nucleate. When compared to the experimental control sample, in which approximately 10 or more protein crystals spontaneously nucleate, the protein crystals that nucleate due to the laser are fewer and nucleate more quickly. Once the protein crystals nucleate, they can be grown using any of the known crystal growth methods.

For the procedure, the supersaturated solution preferably has a pH of between 2 and 12, and is maintained at a temperature of between 0 C. and 80 C. Further, the preferred supersaturated solution has between 0.1% and 50% protein by weight. Again, the selection of the pH, the temperature, and the percent protein composition of the supersaturated solution is variable, depending on the type of solution being subjected to the process, and the desired result. One of ordinary skill in the art can select the desired pH, temperature and percent protein without undue experimentation.

A hanging drop system can be used in conjunction with the laser so that the laser can be focused on individual drops to induce nucleation with identical drops set aside as controls. This allows direct comparison of crystals produced by identical experiments using laser induced nucleation and spontaneous nucleation.

6. Results

Experimental results were most successful with protein solutions of a supersaturation of approximately 100%. These protein solutions would nucleate spontaneously in periods of 4–7 days and could be nucleated by the laser after 2 days. Laser induced nucleation normally produced 1–3 crystals where spontaneous nucleation produced large numbers (greater then 10) of crystals. The laser-induced crystals therefore were significantly larger then those obtained by spontaneous nucleation. Experiments with lower supersaturations were less successful because of the very long aging times required.

The results of the method indicate the importance in optimizing the supersaturation so as to reduce the aging time. It also suggests that the laser works by acting on existing large clusters of molecules rather than by forming such clusters since the solutions must be aged for the laser to induce nucleation. The results demonstrate that laser-induced nucleation can provide a method to induce nucleation in protein solutions and to control the number of nuclei formed.

7. Additional Applications of the Method

In addition to providing nucleation in general, the use of a laser can provide for positional nucleation. Currently, in spontaneous nucleation processes, crystals nucleate at random within the solution. Similarly, in seeded nucleation processes, crystals nucleate at the seeds, which can travel anywhere throughout the solution. With laser nucleation, the laser beam can be directed precisely through the solution. Thus, the laser beam can be directed through the heart of the solution (such as, for example, through the thickest part of the drop in hanging drop processes) or through a certain part of the solution if it is desired to nucleate at a certain site within the solution.

Also, as discussed above, by using laser nucleation, the nucleation process can be started earlier (hours rather than days after supersaturating the solution). Thus, rather than having to wait for the spontaneous nucleation to begin, crystals can be nucleated on a relatively set schedule. In this manner, crystals can be grown more timely and as necessary.

Based on the known phenomena that if fewer crystals nucleate, larger crystals grow, the use of laser nucleation can allow the growth of larger crystals. Because the supersaturated protein solution is nucleated by the laser prior to the spontaneous nucleation time event, spontaneous nucleation is reduced or eliminated until after the desired protein crystals have been nucleated and grown. As a result, fewer, but larger crystals are grown using laser nucleation.

Additionally, the present method allows a high throughput of protein crystal nucleation. Thus, even though in a specific quantity of supersaturated protein solution fewer crystals are nucleated, more samples can be nucleate in any given time (without the uncertainty of when the crystals will nucleate inherent in spontaneous nucleation). For example, in the use of hanging droplets, the laser can be used to nucleate a whole series of the droplets, such as subjecting a whole line of hanging droplets to the laser by moving the laser sequentially to hit each droplet. This can allows the nucleation of protein crystals in hundreds of droplets in a short period of time.

The above detailed description of the preferred embodiments, including the example methods, and the appended figures are for illustrative purposes only and are not intended to limit the scope and spirit of the invention, and its equivalents, as defined by the appended claims. One skilled in the art will recognize that many variations can be made to the invention disclosed in this specification without departing from the scope and spirit of the invention.

What is claimed is:

1. A method of inducing the nucleation of protein crystals comprising the steps of:
   a. preparing a supersaturated solution of a protein in a solvent;
   b. selecting a wavelength, power and polarization state of light necessary to induce the crystallization of a protein crystal from the supersaturated solution of the protein in the solvent; and
   c. subjecting the supersaturated solution to the light for a period of time so as to induce nucleation of the protein crystal.

2. The method as claimed in claim 1, wherein the supersaturated solution is subjected to laser light until at least a portion of the protein in the supersaturated solution has crystallized into the protein crystal.

3. The method as claimed in claim 2, wherein the laser light is at such a wavelength that the supersaturated solution will not absorb the laser light.

4. The method as claimed in claim 2, wherein supersaturation is achieved by a method selected from the group consisting of cooling, heating, solvent evaporation, and altering solvent composition.

5. The method as claimed in claim 1, wherein the solvent is selected from the group consisting of organic solvents, inorganic solvents, and supercritical solvents.

6. The method as claimed in claim 2, wherein the laser light is pulsed.

7. The method as claimed in claim 6, wherein the laser light pulses at between 1 pulse and 100 pulses per second.

8. The method as claimed in claim 7, wherein the laser light pulses at approximately 10 pulses per second.

9. The method as claimed in claim 1, wherein the supersaturated solution is subjected to the laser light for a period of between 0.01 second and 60 seconds.

10. The method as claimed in claim 6, wherein the laser light is in the near infrared range.

11. The method as claimed in claim 1, wherein the supersaturated solution further comprises a buffer.

12. The method as claimed in claim 11, wherein the buffer is selected from the group consisting of acetate buffer, citrate buffer, phosphate buffer, sodium acetate buffer, sodium phosphate buffer, and potassium phosphate buffer.

13. The method as claimed in claim 1, wherein the precipitant is selected from the group consisting of MES,2-(N-morpholino)-ethanesulfonic acid, ammonium acetate, glycerol, spermine, cacodylate, potassium chloride, ethanol, phosphate, HEPES, potassium phosphate, sodium citrate, sodium phosphate, calcium chloride, EDTA, dithiothreitol, sodium acetate, sodium cacodylate, magnesium chloride, sodium azide, 2-methyl-2,4-pentanediol, sodium chloride, tris-HCI, ammonium sulfate, PEG (200-35000) (with PEG 4000, PEG 6000 and PEG 8000 being used most often out of the PEGs).

14. The method as claimed in claim 1, wherein the supersaturated solution has a pH of between 2 and 12.

15. The method as claimed in claim 14, wherein the supersaturated solution has a pH of approximately 4.0.

16. The method as claimed in claim 1, wherein the supersaturated solution is maintained at a temperature of between 0 C. and 80 C.

17. The method as claimed in claim 16, wherein the supersaturated solution is maintained at a temperature of approximately 25 C.

18. The method as claimed in claim 1, wherein the supersaturated solution comprises between 0.1% and 50% protein.

19. The method as claimed in claim 1, wherein the laser light is linearly polarized.

20. The method as claimed in claim 1, wherein the laser light is circularly polarized.

21. A method of inducing the nucleation of protein crystals comprising the steps of:

a. preparing a supersaturated solution comprising a protein and a solvent;

b. selecting a state of laser light necessary to induce nucleation of a protein crystal from the supersaturated solution; and c. subjecting the supersaturated solution to the light for a period of time so as to induce nucleation of the protein crystal.

22. The method as claimed in claim 21, wherein the supersaturated solution is subjected to laser light until at least a portion of the protein in the supersaturated solution has crystallized into the protein crystal.

23. The method as claimed in claim 22, wherein the laser light has a wavelength in the near infrared range and has a polarization selected from the group consisting of linear polarization and circular polarization.

24. The method as claimed in claim 23, wherein the laser light is pulsed.

25. The method as claimed in claim 24, wherein the laser light pulses at between 1 pulse per second and 100 pulses per second.

26. A method for controlling the nucleation of protein crystals comprising the steps of:

a. preparing a supersaturated solution of a protein in a solvent;

b. selecting a wavelength, power and polarization state of laser light necessary to induce the crystallization of a protein crystal from the supersaturated solution of the protein in the solvent;

c. subjecting the supersaturated solution to the laser light for a period of time so as to induce nucleation of the protein crystal; and d. varying the wavelength, power and polarization state of the laser light so as to control the parameters of the nucleation of the protein crystals.

27. The method as claimed in claim 26, wherein the supersaturated solution is subjected to laser light until at least a portion of the protein in the supersaturated solution has crystallized into at least one protein crystal.

28. The method as claimed in claim 27, wherein the laser light is pulsed.

29. The method as claimed in claim 28, wherein the laser light pulses at between 1 pulse and 100 pulses per second.

30. The method as claimed in claim 26, wherein the supersaturated solution is subjected to the laser light for a period of between 0.01 second and 60 seconds.

31. The method as claimed in claim 26, wherein the laser light is in the near infrared range.

32. The method as claimed in claim 26, wherein the laser light is linearly polarized.

33. The method as claimed in claim 26, wherein the laser light is circularly polarized.

* * * * *